(12) United States Patent
Cho et al.

(10) Patent No.: US 7,346,879 B2
(45) Date of Patent: Mar. 18, 2008

(54) SYMMETRIC SIGNAL DISTRIBUTION THROUGH ABUTMENT CONNECTION

(75) Inventors: Jung Cho, Allentown, PA (US); Robert M. Kylor, Easton, PA (US); Vladimir Sindalovsky, Perkasie, PA (US); Lane A. Smith, Easton, PA (US)

(73) Assignee: Agere Systems Inc., Allentown, PA (US)

( * ) Notice: Subject to any disclaimer, the term of this patent is extended or adjusted under 35 U.S.C. 154(b) by 136 days.

(21) Appl. No.: 10/880,216

(22) Filed: Jun. 29, 2004

(65) Prior Publication Data

US 2005/0289496 A1 Dec. 29, 2005

(51) Int. Cl.
*G06F 17/50* (2006.01)

(52) U.S. Cl. ............................. 716/12; 716/14; 716/17

(58) Field of Classification Search ................ 716/4, 716/1, 2, 10, 11; 257/208
See application file for complete search history.

(56) References Cited

U.S. PATENT DOCUMENTS

| | | | |
|---|---|---|---|
| 5,808,897 A * | 9/1998 | Miller et al. .................... 716/1 |
| 6,202,194 B1 * | 3/2001 | Seningen et al. .............. 716/10 |
| 6,336,207 B2 * | 1/2002 | Shinomiya et al. ............ 716/11 |
| 6,642,556 B2 * | 11/2003 | Ulrey ........................... 257/208 |
| 6,735,742 B2 * | 5/2004 | Hatsch et al. .................... 716/2 |
| 6,865,721 B1 * | 3/2005 | Dahl et al. ....................... 716/2 |
| 2001/0049815 A1 * | 12/2001 | Shinomiya et al. ............ 716/11 |

* cited by examiner

*Primary Examiner*—Leigh M. Garbowski

(57) ABSTRACT

The present invention provides a method and apparatus for managing a large number of associated interconnects within an integrated circuit involving a modular approach to the macro cell layout. In particular, internal signal paths are created within each macro cell that permit connections to other macros by abutting these macros adjacent to one another. Moreover, these internal signal paths permit efficient distribution of a common source signal to each of such connected macros. The layout of the internal macro cell signal paths of the present invention also permits each of these macros to be reflected about its Y-axis, thereby increasing its versatility in being utilized in various circuit designs.

24 Claims, 5 Drawing Sheets

SYMMETRIC SIGNAL DISTRIBUTION THROUGH ABUTMENT CONNECTION

FIELD OF THE INVENTION

The present invention generally relates to semiconductors and more specifically to signal routing between macros by abutment placement of these macros.

BACKGROUND OF THE INVENTION

The layout for large-scale integrated microchips is one of the most time consuming tasks in the design cycle for an integrated circuit (IC). One input to this design process is a partitioned circuit wherein elementary components of the circuit are grouped to build a number of macro cells. On the borders of these cells, signal trace endpoints or terminals are located to provide signal paths between circuit blocks of the IC and connection layers such as metal or polysilicon layers. These connection layers, also known as interconnects, require some finite width and thickness to ensure reliability of the interconnect and signal integrity.

The output of this design process is a layout for the integrated circuit. The layout describes the placement of the macro cells and the routes for the interconnects between the macro cells. One common objective in layout optimization is to find an arrangement that minimizes overall area. Cells are not allowed to overlap each other, and the routing has to meet specific technical constraints, i.e., space between parallel wires has to be added to prevent short circuits and transmission effects, and for some critical traces, the delay has to stay below a given threshold, which results in maximal admissible wire lengths for these traces.

One frequently occurring situation encountered in this design process is when a single source is used to generate identical or duplicate signals, e.g., clocks, currents, etc. that are to be supplied to multiple destinations. An example would be a biasing current that is being supplied to analog circuits. The distribution of these currents can be a significant challenge in situations where the analog circuits are macro-based and multiple distributions are to occur. This becomes even more difficult when the multiple analog circuits require independent biasing currents from the source. That is, while the source can readily produce independent biasing current for any number of analog macros, providing each current to each analog macro is problematic due to the fact that biasing currents are delicate and sensitive signals.

Frequently in the prior art custom routing is employed. This not only increases costs of design but invariable results in increased numbers of signal paths between blocks. When numerous signal paths are required between circuit blocks, the routing congestion caused by placement of the associated interconnects will increase the overall size of the IC and thus increase the cost of the product. That congestion has an increased effect when the area between the circuit blocks is limited. A further problem arises when numerous tightly spaced functional blocks require a high number of signal paths between these blocks. The associated numerous interconnects will cause even more IC area congestion that will further increase the IC size and associated cost.

SUMMARY OF THE INVENTION

The present invention overcomes the disadvantages and limitations of the prior art by providing a method and apparatus to reduce or eliminate the need to connect individual macro cell signals with traces that are supplemental to the macro cell layout. In particular, in circumstances where a macro can be employed for multiple instantiations, and where such design signals must be distributed to each instantiation, certain commonalities may exist which can be exploited to effect the routings. That is, a custom route is, in effect, created inside the macros and the connection between macros and the source signal is achieved by abutting these macros adjacent to one another so that the signal connections are made to adjacent macros.

Thus, in the example where the source signal is a biasing current, each of the analog macros can be supplied their own independent biasing current with minimal, if any, routing paths external to the analog macros. Further, these analog macros are capable of being reflected (i.e., symmetric) in their Y-axis while maintaining the one-to-one connection by abutment in the layout. This capability provides greater flexibility in the use of various designs.

BRIEF DESCRIPTION OF THE DRAWINGS

Various embodiments of the present invention will now be described in detail in conjunction with the annexed drawings, in which.

DETAILED DESCRIPTION

The present invention provides a method and apparatus for managing a large number of associated interconnects within an integrated circuit involving a modular approach to the macro cell layout. The invention is particularly applicable in situations in which a single source is used to generate identical or duplicate signals that are to be supplied to multiple destinations. The following embodiments of the invention will be described with reference to biasing currents (IBIAS) being supplied to multiple analog circuits. The invention is not so limited however, as it is applicable to any distribution of one or more signals to multiple destinations (to include digital signals and/or non-analog macros).

In the following discussions, the exemplary macro cell is a rectangle and in the accompanying figures, the terms "left", "right", "L", "R", "top" and "bottom" are introduced to describe the relationship between one side of the macro cell and its opposing side. These terms are not meant to imply any one particular orientation or shape of the macro cell. It should be understood from the present context that these terms are exemplary and non-limiting. Furthermore, the concepts of the present invention are more broadly applicable to macro cells of other shapes. Generally, macro cells are square or rectangular, as such shapes are most practical, but the invention can be applied to macro cells of any symmetric, four-sided polygonal shape. In fact, in theory, the invention could be applied to non-symmetric polygons and/or polygons of any number of sides, although such shapes are not likely to be practical in most cases.

Generally, the invention is most effectively used when a plurality of macro cells have similar shape and are laid out so that they have parallel adjacent sides. However, while not perhaps as practical, in theory, the macro cells need not necessarily all have the same shape and the plurality of macro cells need not be laid out so that every side of every macro is adjacent and/or parallel to a side of another macro cell.

Figure 1:
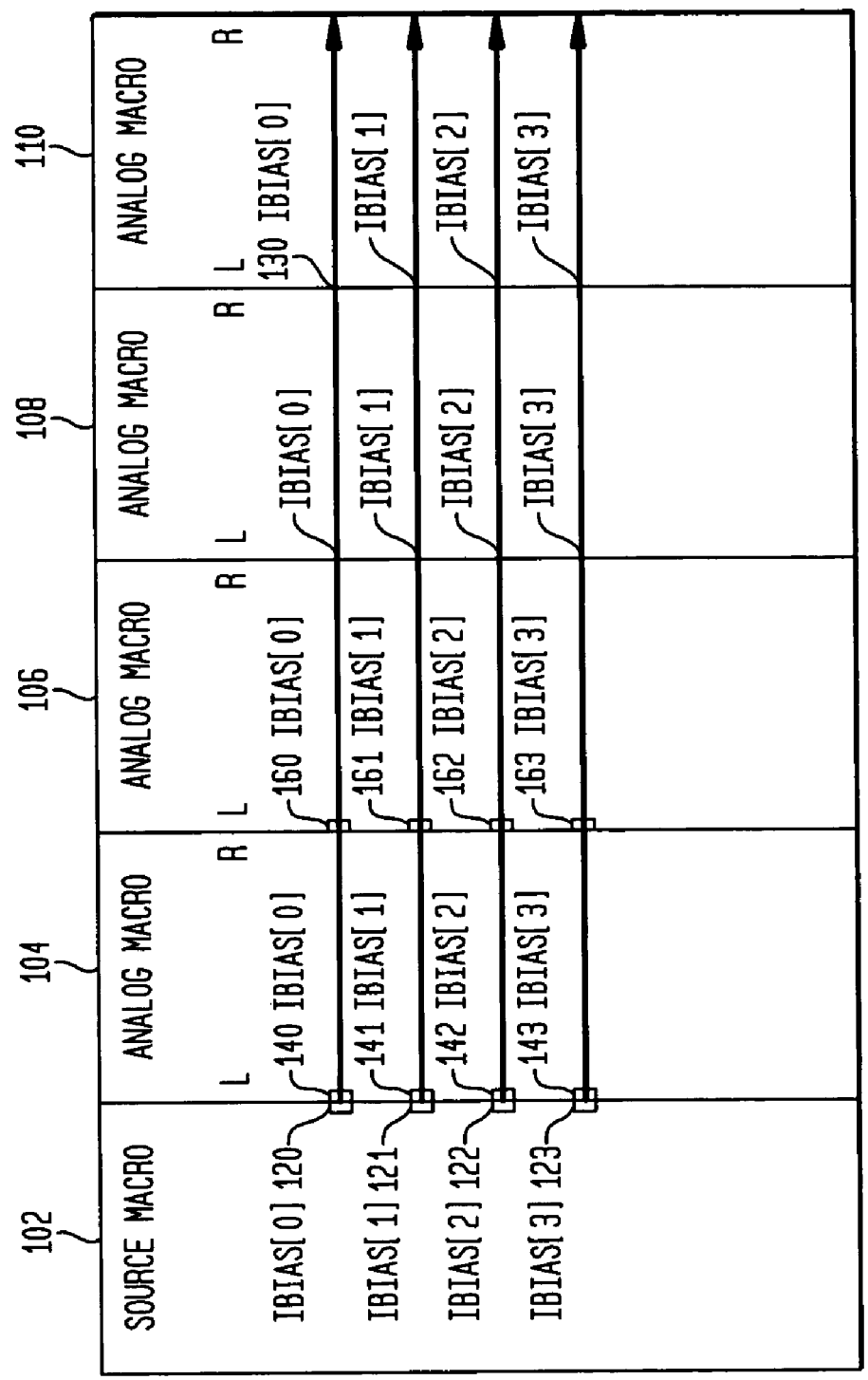
FIG. 1 is a schematic diagram of a typical macro cell layout where routing of source signals comprises abutting successive macro cells.

FIG. 1 illustrates an example of a source macro 102 generating identical bias currents at four separate output terminals (IBIAS[0-3]). These bias currents are distributed to four analog macros (104, 106, 108 and 110), where these macros are abutted together in the manner shown. In such a circuit, only one IBIAS signal can be used per analog macro. Assuming Analog Macro 104 receives its IBIAS signal at its input terminal IBIAS[0] 140, this signal is tapped off and thereby terminates within the Analog Macro 104 and does not propagate along the indicated path 130. Consequently, Analog Macro 106 must receive its IBIAS signal via a terminal location different than its IBIAS [0] input terminal 160. Accordingly, since the input terminal receiving the IBIAS signal thus varies, four different analog macros designs are required. While it would be possible to use four identical macros, this would require some additional routing external to the macros and accordingly is subject to many of the problems in the prior art that the practice of abutting macros is attempting to overcome.

Figure 2:
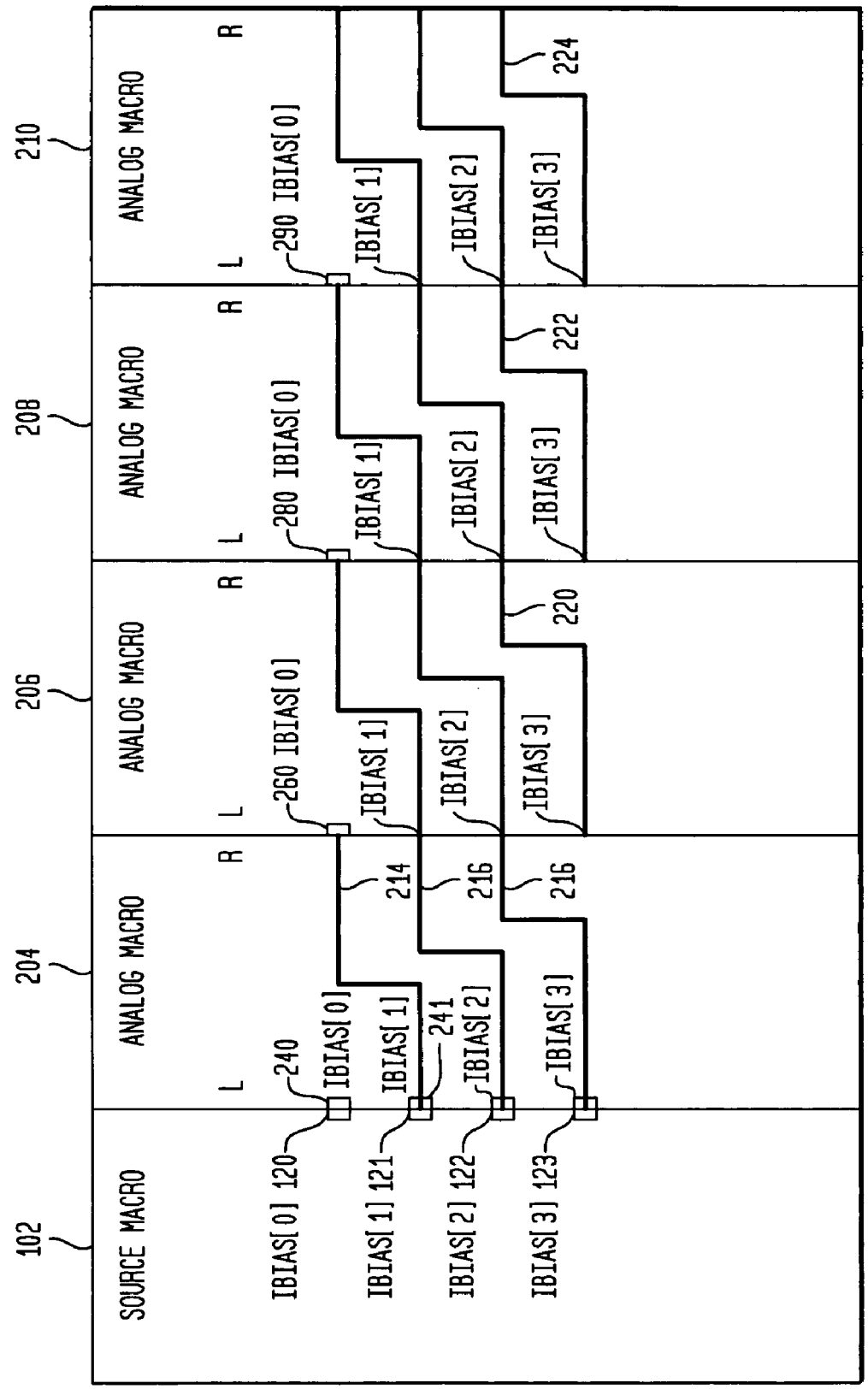
FIG. 2 is a schematic diagram of a macro cell layout in which the macro cells are abutted which further depicts the custom routing performed inside of the macros.

FIG. 2 illustrates four identical analog macros (204, 206, 208 and 210) which are being supplied a bias signal from Source Macro 102. FIG. 2 further illustrates custom routing done inside each of these macros as a logic shifter. As illustrated, this shifting occurs to place a "live" or untapped signal at the top of the macro's right edge for connecting to a subsequent macro. Each analog macro contains an input terminal or port (IBIAS[0]) that connects to one of the IBIAS output terminals (IBIAS[0-3], items 120, 121, 122 and 123) of the Source Macro 102. That is, path 214 supplies the IBIAS current at output terminal IBIAS[1], item 121, of Source Macro 102 to the IBIAS[0] input terminal, item 260 of Analog Macro 206. Similarly, paths 216 and 218 supply an IBIAS signal to input terminals 280 and 290 of Analog Macros 208 and 210, respectively. Input terminal, item 240 of Analog Macro 204, receives an IBIAS signal directly from its abutment to output terminal IBIAS[0], item 120, of the source macro.

FIG. 2 illustrates an example in which four analog macros and four output IBIAS terminals are being employed. The number of IBIAS output terminals can be as large as needed to supply a larger number of analog macros, as long as the shifter routing inside each of the analog macros is done accordingly to match the source macro. It should also be noted that not all of the IBIAS outputs from the source macro need to be connected to an analog macro—e.g., in FIG. 2, less than four analog macros could be abutted using the internal routing of the analog macro depicted.

Figure 3B:
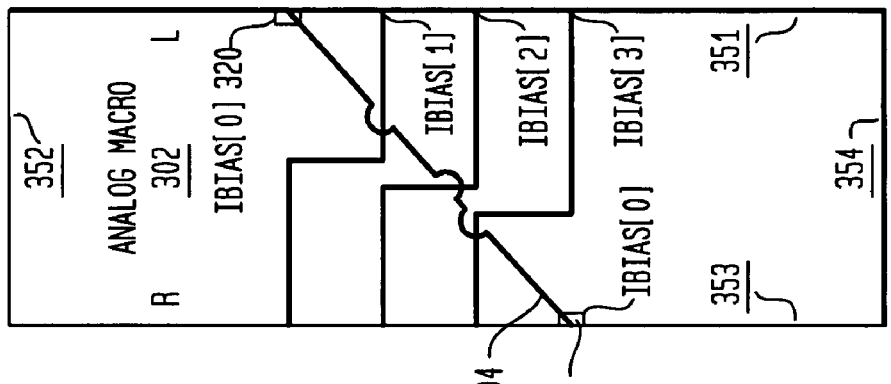
FIGS. 3A and 3B are schematic diagrams of an embodiment of the invention in which the internal routing performed inside of the macros comprises an additional diagonal routing which permits the macro to be reflected about its Y-axis, FIG. 3B being the post-reflection of FIG. 3A.
Figure 3A:
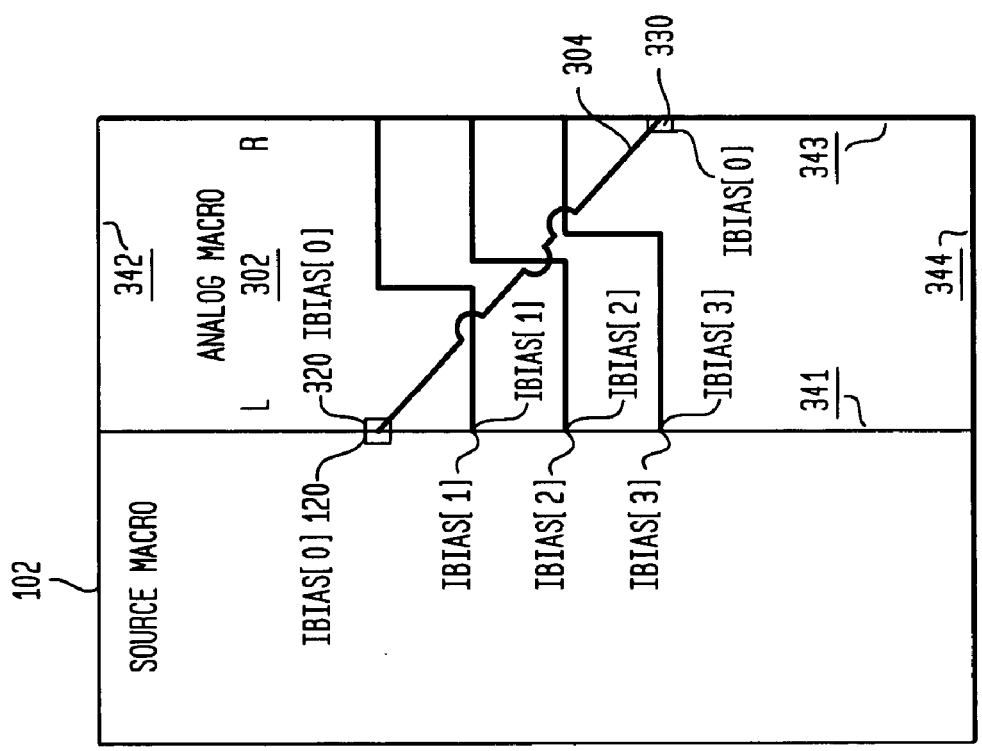

FIGS. 3A and 3B illustrate an embodiment of the invention in which the internal routing performed inside of the analog macros comprises an additional diagonal routing path 304. Thus as depicted in FIG. 3A, the IBIAS[0] terminal positioned on the left edge L of Analog Macro 302, item 320, is electrically connected to another IBIAS[0] terminal, item 330, positioned on the right edge R. This creation of a duplicate terminal or port of IBIAS[0] on the opposed edge of the macro realizes several advantages. One such example is that it permits the macro to be reflected about its Y-axis. FIG. 3B depicts the post reflection of the analog macro of FIG. 3A. This reflection capability provides additional flexibility in the use of an analog macro (such as Analog Macro 302) in circuit design. Accordingly, such an analog macro will have increased utility in that it can be employed in a greater number of designs.

The above described internal routing of Analog Macro 302 in FIG. 3A can be described more generally with the introduction of some additional terms, and without any references to "left" and "right" edges. Analog Macro 302 can be described as having first, second, third and fourth edges, items 341-344 respectively. The first edge 341 is opposed to the third edge 343 and the second edge 342 is opposed to the fourth edge 344. Terminals are located along both the first and third edges. These terminals are sequentially numbered 1 through n (n being 4 in FIG. 3A) with 1 being the location nearest the second edge 342. The routing path 304 can then be described as being between the edge terminal (item 320) at location 1 on the first edge and the edge terminal (item 330) at location n on the third edge. Each of the remaining paths can then be described as being between the edge terminal at location k on the first edge 341 and the edge terminal at location k−1 on the third edge 343. It should be noted that Analog Macro 302 of FIG. 3B is also accurately described by this convention with the first, second, third and fourth edges being items 351-354, respectively.

Figure 4:
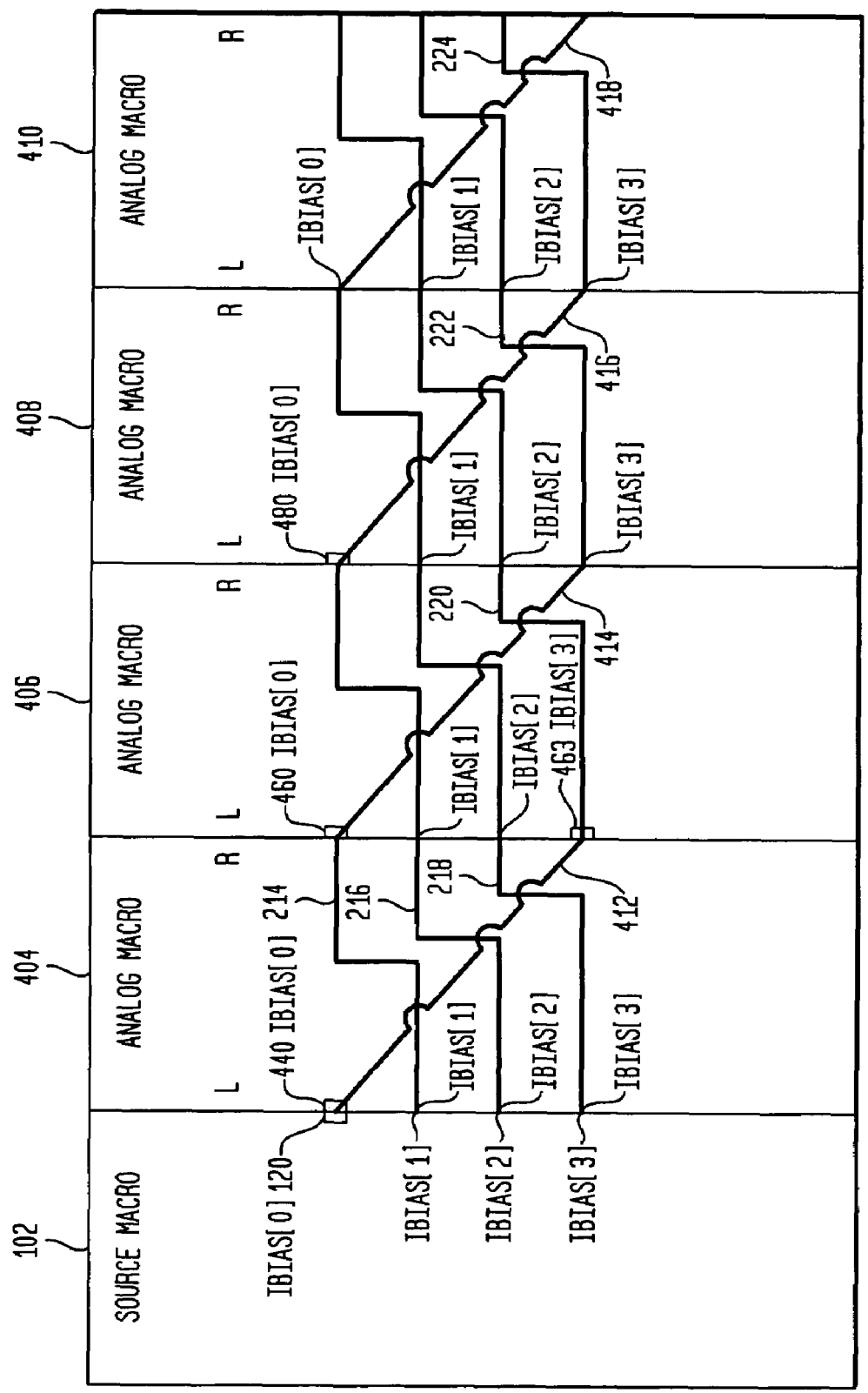
FIG. 4 is a schematic diagram of the additional diagonal routing of the present invention being applied to layout of FIG. 2; and, FIG. 5 is a schematic diagram of an additional embodiment of the invention which illustrates use of the post-reflected macros of FIG. 3B employed in a macro cell layout containing abutted macro cells.

An additional advantage of this embodiment of the invention is illustrated in FIG. 4 in which each of the analog macros of FIG. 2 (204, 206, 208 and 210) have been replaced by Analog Macro 302 (and identified in the figure as 404, 406, 408 and 410 respectively). As noted above in the discussion of FIG. 2, paths 214, 216 and 218 supply an IBIAS signal from Source Macro 102 to Analog Macros 406, 408 and 410, respectively. One important distinction between the circuits depicted in FIGS. 2 and 4 is that previously there existed several floating paths, paths that are essentially unconnected, lacking both a source and a destination. The presence of floating paths creates problems in some delicate circuits as such paths are susceptible to noise.

FIG. 4 illustrates how each of the previous floating paths of FIG. 2 (220, 222 and 224) are now electrically connected to an IBIAS[0] terminal of an analog macro. Thus, path 220 is now connected at terminal 463, via path 412 to the IBIAS[0] terminal, item 440, of Analog Macro 404. Similarly, previous floating paths 222 and 224 are also now connected by the analog macro's internal routing according to this embodiment of the invention (path 414 connecting 222 to terminal 460 of Analog Macro 406 and path 416 connecting 224 to terminal 480 of Analog Macro 408).

Figure 5:
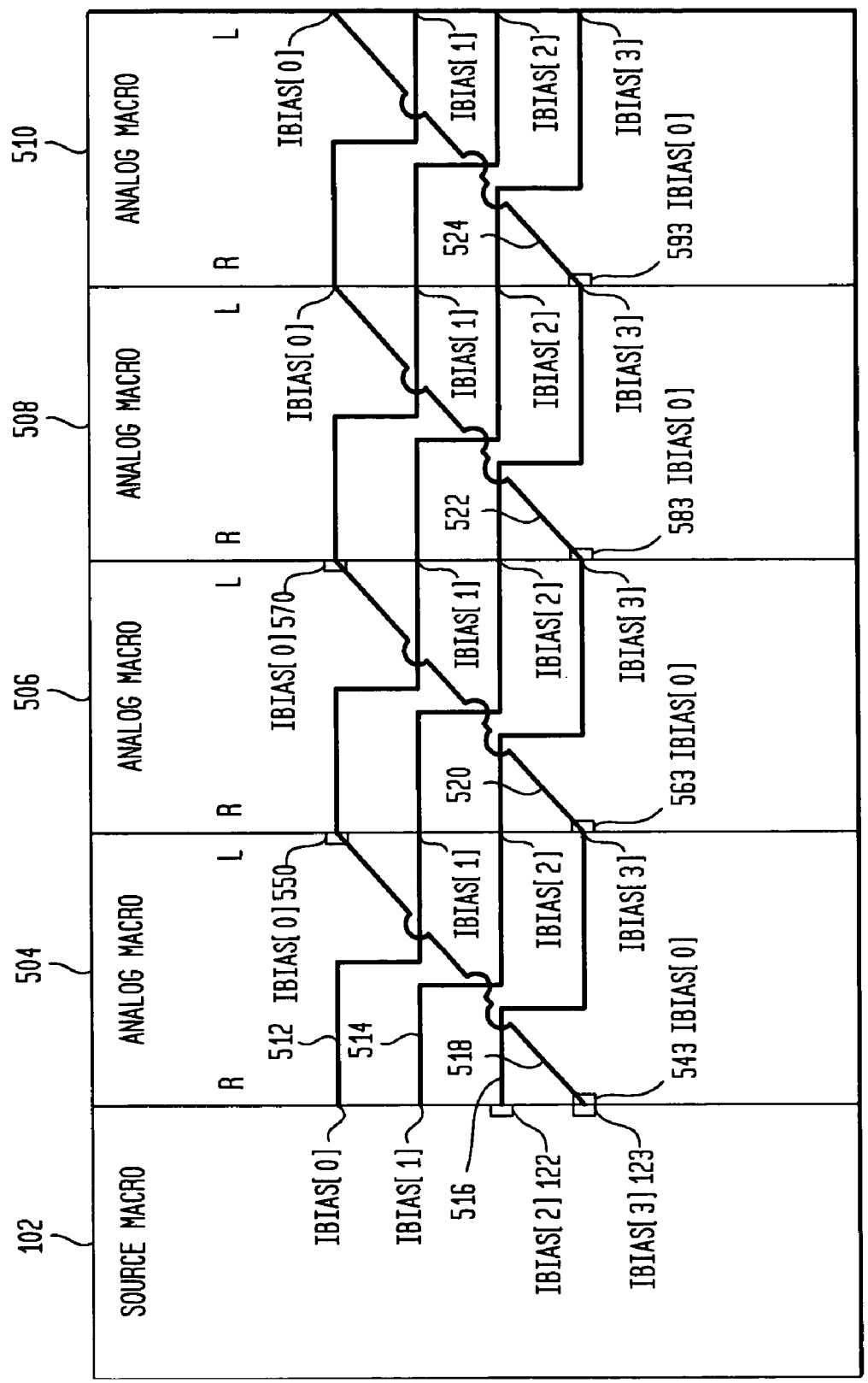

FIG. 5 is a schematic diagram of an additional embodiment of the invention which illustrates use of the reflected macro of FIG. 3B. As in FIG. 2, four analog macros (504, 506, 508 and 510) are supplied a biasing current from the Source Macro 102. As illustrated, each right edge (R) of the analog macros appears on the left side of the macro. The shifter is still maintained in each macro. However, the start connection from the Source Macro 102 has changed compared to the layout of FIG. 2. That is, the source macro output connection IBIAS[3], item 123, connects via a direct abutment with the IBIAS[0] terminal, item 543 appearing on the "R" edge of Analog Macro 504 and via diagonal path 518, to a duplicate IBIAS[0] terminal, item 550, appearing on the "L" edge of the analog macro. The source macro output connection IBIAS[2], item 122, connects via path 516 to the "R" IBIAS[0] terminal, item 563 of Analog Macro 506 and via path 520, to its "L" IBIAS[0] terminal, item 570 as well. Similarly, IBIAS[0] terminals of Analog Macros 508 and 510 (items 583 and 593, respectively) are connected to the appropriate IBIAS from the Source Macro 102. Relative to FIG. 2, the order of the connections has been changed using the reflected macro, yet the function of providing a source signal to each IBIAS[0] input terminal of the analog macros has been maintained. Moreover, this function has been achieved without the need of any external paths. Further, the floating connections (220, 222 and 224) present in FIG. 2 have been eliminated.

While the invention has been described with reference to the preferred embodiment thereof, it will be appreciated by those of ordinary skill in the art that modifications can be made to the structure and elements of the invention without departing from the spirit and scope of the invention as a whole.

What is claimed is:

1. A method of routing internal signal paths contained on a macro cell, the macro cell having a top edge, a bottom edge, a left edge and a right edge, the internal routing occurring between a plurality of left terminals on the macro cell to a plurality of right terminals on the macro cell, the method comprising the steps of:

placing n left terminals at terminal locations on the left edge of the macro cell, where said left terminal locations are sequentially numbered 1 through n, with 1 being a location nearest the top edge, and wherein n is an integer;

placing n right terminals at terminal locations on the right edge of the macro cell, where said right terminal locations are sequentially numbered 1 through n, with 1 being a location nearest the top edge; and wherein said right terminals are adapted to contact left terminals of an additional macro cell whenever the left terminals of the additional macro cell are physically aligned with and connected to the right terminals of the macro cell; and, routing the internal signal paths between the left terminals of the macro cell and the right terminals of the macro cell so that an internal signal path is established between the left terminal location at location 1 and the right terminal location at location n, and for each integer k, $1<k\leq n$, an internal signal path is established between the left terminal of the macro cell at terminal location k and the right terminal at terminal location k−1.

2. The method of claim 1 further comprising the step of: supplying input signals to the macro cell to at least one of the left terminals of the macro cell.

3. The method of claim 1 further comprising the step of: supplying input signals to the macro cell to at least one of the right terminals of the macro cell.

4. A method of establishing signal paths between macro cells, each macro cell having a top edge, a bottom edge, a left edge and a right edge; the method comprising the steps of:

placing n left terminals at terminal locations on the left edge of a first macro cell, where said left terminal locations are sequentially numbered 1 through n, with 1 being the location nearest the top edge, and wherein n is an integer;

placing n right terminals at terminal locations on the right edge of the first macro cell, where said right terminal locations are sequentially numbered 1 through n, with 1 being a location nearest the top edge; and wherein said right terminals are adapted to contact left terminals of a second macro cell whenever the left terminals of the second macro cell are physically aligned with and connected to the right terminals of the first macro cell;

routing the internal signal paths between the left terminals of the first macro cell and the right terminals of the first macro cell so that an internal signal path is established between the left terminal at location 1 and the right terminal at location n; and for each integer k, $1<k\leq n$, an internal signal path is established between the left terminal at location k and the right terminal at location k−1; and placing the second macro cell in contact with the first macro cell such that at least one of the left terminals on the second macro cell are physically aligned with and connected to at least one of the right terminals of the first macro cell.

5. The method of claim 4 wherein the right terminal locations on the right edge of the first macro cell correspond to the left terminal locations on the left edge of the second macro cell.

6. The method of claim 4 further comprising the step of: supplying input signals to the first macro cell at the left terminals of the first macro cell.

7. The method of claim 4 further comprising the step of: supplying input signals to the second macro cell at the right terminals of the second macro cell.

8. The method of claim 4 wherein the said first macro cell and said second macro cell are identical.

9. The method of claim 4 further comprising the step of: reducing occurrences of floating paths when said macro cells are connected.

10. A macro cell that reduces the need for external signal paths when the macro cell is connected by abutment to additional macro cells, each of said macro cells having a top edge, a bottom edge, a left edge and a right edge; the macro cell comprising:

a plurality of n left terminals placed at terminal locations on the left edge of the macro cell, where said left terminal locations are sequentially numbered 1 through n, with 1 being a location nearest the top edge, and wherein n is an integer;

a plurality of n right terminals placed at terminal locations on the right edge of the macro cell, where said right terminal locations are sequentially numbered 1 through n, with 1 being a location nearest the top edge; and wherein said right terminals are adapted to contact left terminals of an additional macro cell whenever the left terminals of the additional macro cell are physically aligned with and connected to the right terminals of the macro cell; and, a plurality of internal signal paths between the plurality of left terminals of the macro cell and the plurality of right terminals of the macro cell so that an internal signal path is established between the left terminal location at location 1 and the right terminal location at location n, and for each integer k, $1<k\leq n$, an internal signal path is established between the left terminal of the macro cell at terminal location k and the right terminal at terminal location k−1.

11. The macro cell of claim 10 wherein the left terminals on the macro cell are configured to receive input signals to the macro cell.

12. The macro cell of claim 10 wherein the right terminals on the macro cell are configured to receive input signals to the macro cell.

13. A method of routing internal signal paths contained on a macro cell, the macro cell having a surface in the shape of a polygon having first, second, third and fourth edges, wherein said first edge is opposed to said third edge and said second edge is opposed to said fourth edge; said internal routing occurring between a plurality of terminals located on the first edge and a plurality of terminals located on the third edge, the method comprising the steps of:

placing n terminals at terminal locations on the first edge of the macro cell, where said first edge terminal locations are sequentially numbered 1 through n, with 1 being a location nearest the second edge, and wherein n is an integer;

placing n terminals at terminal locations on the third edge of the macro cell, where said third edge terminal locations are sequentially numbered 1 through n, with 1 being a location nearest the second edge; and wherein said edge terminals on the third edge are adapted to contact terminals of an additional macro cell whenever the terminals of the additional macro cell are physically aligned with and connected to the edge terminals on the third edge of the macro cell; and, routing the internal signal paths between the edge terminals on the first edge of the macro cell and the edge terminals on the third edge of the macro cell so that an internal signal path is established between the edge terminal location at location 1 on the first edge and the edge terminal location at location n on the third edge, and for each integer k, $1<k\leqq n$, an internal signal path is established between the edge terminal of the macro cell at terminal location k on the first edge and the edge terminal at terminal location k−1 on the third edge.

14. The method of claim 13 further comprising the steps of: supplying input signals to the macro cell to at least one of the terminal locations on the first edge of the macro cell.

15. The method of claim 13 further comprising the step of: supplying input signals to the macro cell to at least one of the terminal locations on the third edge of the macro cell.

16. A method of establishing signal paths between macro cells, each said macro cell having a surface in the shape of a polygon having first, second, third and fourth edges, wherein said first edge is opposed to said third edge and said second edge is opposed to said fourth edge; said method comprising:

placing n terminals at terminal locations on the first edge of a first macro cell, where said first edge terminal locations are sequentially numbered 1 through n, with 1 being a location nearest the second edge, and wherein n is an integer;

placing n terminals at terminal locations on the third edge of the first macro cell, where said third edge terminal locations are sequentially numbered 1 through n, with 1 being a location nearest the second edge; and wherein said edge terminals on the third edge are adapted to contact edge terminals on the first edge of a second macro cell whenever the edge terminals on the first edge of the second macro cell are physically aligned with and connected to the edge terminals on the third edge of the first macro cell;

routing the internal signal paths between the edge terminals on the first edge of the first macro cell and the edge terminals on the third edge of the first macro cell so that an internal signal path is established between the edge terminal at location 1 on the first edge and the edge terminal at location n on the third edge; and for each integer k, $1<k\leqq n$, an internal signal path is established between the edge terminal at location k on the first edge and the edge terminal at location k−1 on the third edge; and placing the second macro cell in contact with the first macro cell such that at least one of the edge terminals on the first edge of the second macro cell are physically aligned with and connected to at least one of the edge terminals on the third edge of the first macro cell.

17. The method of claim 16 wherein the terminal locations on the third edge of the first macro cell establish a connection with the terminal locations on the first edge of the second macro cell.

18. The method of claim 16 further comprising the step of: supplying input signals to the first macro cell to at least one of the terminal locations on the first edge of the first macro cell.

19. The method of claim 16 further comprising the step of: supplying input signals to the second macro cell to at least one of the terminal locations on the third edge of the second macro cell.

20. The method of claim 16 wherein the said first macro cell and said second macro cell are identical.

21. The method of claim 16 further comprising the step of: reducing occurrences of floating paths when said macro cells are connected.

22. A macro cell that reduces the need for external signal paths when the macro cell is connected by abutment to additional macro cells, said macro cell having a surface in the shape of a polygon having first, second, third and fourth edges, wherein said first edge is opposed to said third edge and said second edge is opposed to said fourth edge; the macro cell comprising:

a plurality of n terminals placed at terminal locations on the first edge of the macro cell, where said first edge terminal locations are sequentially numbered 1 through n, with 1 being a location nearest the second edge, and wherein n is an integer;

a plurality of n terminals placed at terminal locations on the third edge of the macro cell, where said third edge terminal locations are sequentially numbered 1 through n, with 1 being a location nearest the second edge; and wherein said edge terminals on the third edge are adapted to contact terminals of an additional macro cell whenever the terminals of the additional macro cell are physically aligned with and connected to the edge terminals on the third edge of the macro cell; and, a plurality of internal signal paths between the plurality of edge terminals on the first edge of the macro cell and the plurality of edge terminals of the third edge of the macro cell so that an internal signal path is established between the edge terminal location at location 1 on the first edge and the edge terminal location at location n on the third edge, and for each integer k, $1<k\leqq n$, an internal signal path is established between the edge terminal of the macro cell at terminal location k on the first edge and the edge terminal at terminal location k−1 on the third edge.

23. The macro cell of claim 22 wherein the first edge terminals on the macro cell are configured to receive input signals to the macro cell.

24. The macro cell of claim 22 wherein the third edge terminals on the macro cell are configured to receive input signals to the macro cell.

* * * * *